United States Patent [19]

Donley

[11] 4,299,862
[45] Nov. 10, 1981

[54] ETCHING WINDOWS IN THICK DIELECTRIC COATINGS OVERLYING SEMICONDUCTOR DEVICE SURFACES

[75] Inventor: William B. Donley, Kokomo, Ind.

[73] Assignee: General Motors Corporation, Detroit, Mich.

[21] Appl. No.: 98,210

[22] Filed: Nov. 28, 1979

[51] Int. Cl.³ ............................................. H01L 21/28
[52] U.S. Cl. ......................................... 427/89; 29/571; 427/94; 427/96; 156/644; 156/650; 156/653; 156/657; 156/662
[58] Field of Search ................ 156/653, 657, 644, 650, 156/662; 427/89, 96, 94; 29/571; 430/314

[56] References Cited

U.S. PATENT DOCUMENTS

| | | |
|---|---|---|
| 3,475,234 | 10/1969 | Kerwin et al. |
| 3,541,543 | 11/1970 | Crawford et al. |
| 3,751,722 | 8/1973 | Richman |
| 3,914,855 | 10/1974 | Cheney et al. |
| 4,045,594 | 8/1977 | Maddocks ............................ 427/96 |
| 4,097,889 | 6/1978 | Kern et al. |
| 4,102,733 | 7/1978 | De la Monéda et al. ........... 156/653 |
| 4,103,415 | 8/1978 | Hayes ................................... 29/571 |
| 4,129,936 | 12/1978 | Takei |
| 4,169,270 | 9/1979 | Hayes |
| 4,204,894 | 5/1980 | Komeda et al. ..................... 156/653 |

OTHER PUBLICATIONS

"ROM Program Process May Beat EPROMS in Turn-Around Time" *Electronics*, pp. 39-40, May 25, 1978.

*Primary Examiner*—John D. Smith
*Attorney, Agent, or Firm*—Robert J. Wallace

[57] ABSTRACT

Windows in a glass coating on a semiconductor wafer surface are opened to an underlying semiconductor device region without inadvertently exposing adjacent device portions within the window. In the preferred process a precisely etchable silicon nitride coating is initially applied and windows precisely etched in it. The glass is applied later and preferentially etched, whereby undesired lateral etching of the glass can occur without unintentionally exposing adjacent device portions.

3 Claims, 14 Drawing Figures

P-TYPE SILICON

OXIDIZE

DEPOSIT POLYSILICON

DEFINE GATE ELECTRODE

FORM TRANSISTOR REGIONS

OXIDIZE

DEPOSIT SILICON NITRIDE

ETCH NITRIDE WINDOW

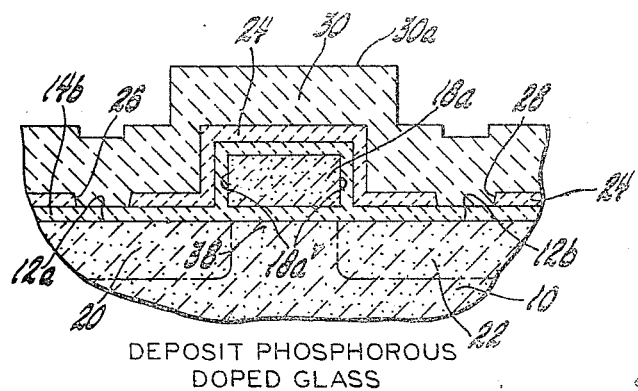
Fig. 9 DEPOSIT PHOSPHOROUS DOPED GLASS
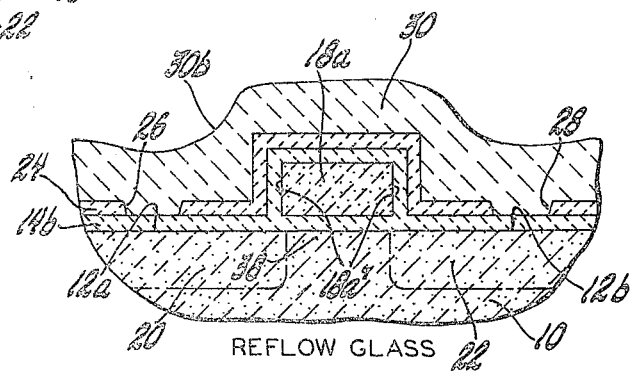
Fig. 10 REFLOW GLASS
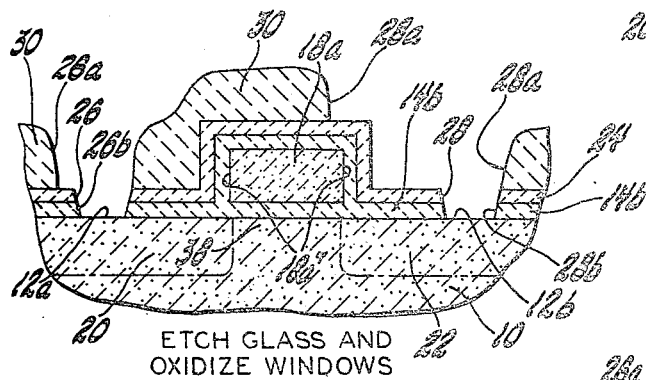
Fig. 11 ETCH GLASS AND OXIDIZE WINDOWS
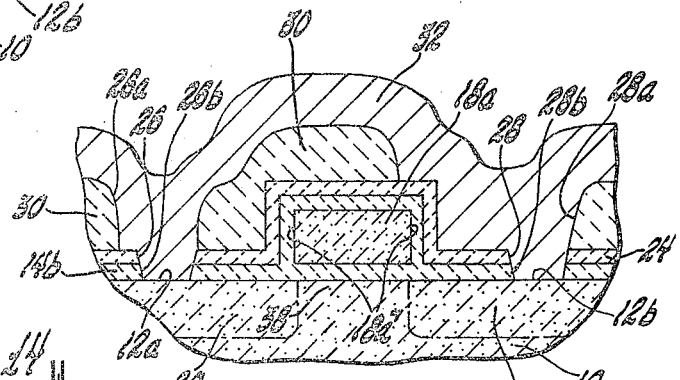
Fig. 12 DEPOSIT METAL
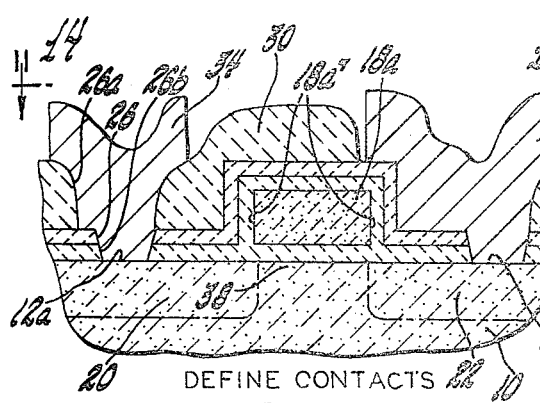
Fig. 13 DEFINE CONTACTS
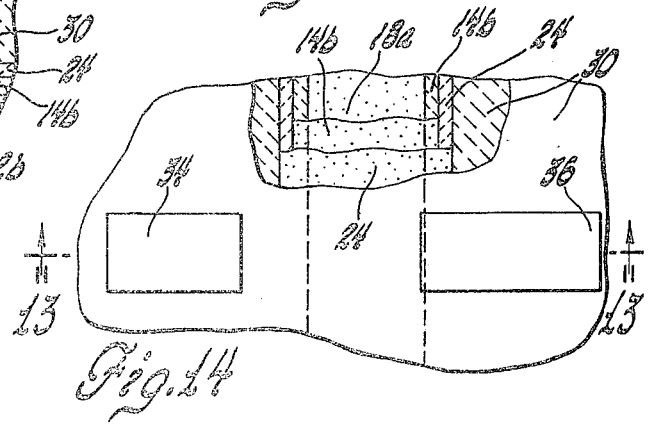
Fig. 14

ETCHING WINDOWS IN THICK DIELECTRIC COATINGS OVERLYING SEMICONDUCTOR DEVICE SURFACES

RELATED APPLICATION

This application is related to my United States patent application Ser. No. 098,211, "Programming an IFGET Read-Only-Memory", which was filed Nov. 28, 1979 and is assigned to the assignee hereof.

FIELD OF THE INVENTION

This invention concerns an etching process for opening windows in relatively thick dielectric coatings overlying semiconductor device portions on a wafer surface. It more particularly relates to opening windows in a glass-like insulating layer overlying insulated gate field effect transistor regions on a silicon surface. The windows, for example, may be for making ohmic contacts to source and drain regions of the insulated gate field effect transistors, which transistors are hereinafter referred to as IGFETS.

BACKGROUND OF THE INVENTION

IGFETS are frequently made with a self-aligning polysilicon gate electrode, using a process analogous to that described in U.S. Pat. No. 3,475,234 Kerwin et al. In the Kerwin et al type of process, a polycrystalline silicon electrode is defined on a previously oxidized silicon surface. The polycrystalline silicon is then used as an etch mask and as a diffusion mask to define source and drain regions in the silicon surface. The polycrystalline silicon is usually doped during the diffusion, to insure that it is a good electrical conductor.

The polycrystalline silicon gate electrode is rather thick and has rather sharp outer edges. These edges are not significantly softened, i.e. rounded, during processing after the gate electrode is formed. In many semiconductor products, as for example an IGFET integrated circuit memory, a metallization pattern must cross over polycrystalline silicon gate electrodes. The abrupt step produced by the sharp-edged gate electrodes can induce latent defects or undesirably high resistance in the overlying metallization pattern. Open circuits can even result. To avoid such problems, it is customary to apply a relatively thick coating of a low temperature glass over the polycrystalline silicon before metallization. The glass is heated to reflow it, and produce less abrupt steps for the metallization pattern to encounter. Use of such a glass overcoat is disclosed in U.S. Pat. No. 4,097,889 Kern et al.

After the glass is applied, contact windows are etched through it and also through an underlying silicon dioxide coating. The contact windows are typically opened by photolithographic etching, in which a photoresist is applied to the silicon surface, a contact mask is used to expose the resist, and the resist is removed from over areas where the contact windows are to be opened. Unfortunately, registration of the contact mask is not always perfect. It is possible that the mask can be misaligned. Also, undesirable lateral etching can occur for other reasons. In any event, such effects also expose an edge of an adjacent polycrystalline silicon gate electrode within a source or drain contact window formed during glass etching. This produces an unwanted electrical short to the gate electrode when the metallization pattern is applied, and the product is defective.

U.S. Pat. No. 4,103,415 Hayes proposes to eliminate such shorts by reoxidizing the silicon slice after etching and before applying the metallization network. If any polycrystalline silicon gate electrodes are exposed in the source and drain contact windows, they will be oxidized to form an electrically insulating coating on them. On the other hand, such a technique requires additional subsequent processing to make the necessary electrical contacts to the gate electrodes. Also, an extended high temperature oxidation treatment is required after the source and drain gate regions have been formed. Still further, the oxidation could undesirably raise electrical resistance of the polycrystalline silicon gate electrodes.

I have found another way to eliminate such shorts. It does not require extra process steps to make gate electrode contacts. It requires an additional intermediate process step, as does the Hayes technique, but this may be offset by eliminating part of another step in the presently known process. Further, my extra step does not require a high temperature oxidation treatment after diffusion regions have been formed.

OBJECTS AND SUMMARY OF THE INVENTION

It is, therefore, an object of this invention to provide an improved process for opening windows in a thick dielectric layer overlying a semiconductor device portion that includes a previously formed electrode.

The invention includes depositing a thin and controllably etchable first dielectric blanket layer onto a semiconductor slice. This first blanket layer is deposited after active regions and some electrodes are formed on the slice but before a thick and less controllably etchable second dielectric is deposited onto the slice. First contact windows are selectively opened in the first dielectric layer and a blanket layer of the second dielectric deposited over the first one. Second contact windows are then opened in the second dielectric layer over the first contact windows, using a preferential etchant. Undesired etching of the second dielectric can thus occur without undesirably exposing the electrodes. The first dielectric is preferably silicon nitride and the second is preferably glass.

BRIEF DESCRIPTION OF THE DRAWING

Other objects, features and advantages of the invention will become more apparent from the following description of preferred examples thereof and from the drawing, in which:

FIGS. 1 through 13 show a series of sectional views through one IGFET area of an integrated circuit showing progressive stages of manufacture;

FIG. 13 is taken along the line 13—13 of FIG. 14;

FIG. 14 is a plan view with parts broken away along the line 14—14 of FIG. 13; and For clarity, background lines in FIGS. 1-13 have been omitted and lines showing surface topography are generally omitted in FIG. 14.

DESCRIPTION OF THE PREFERRED EMBODIMENTS

Figure 1:
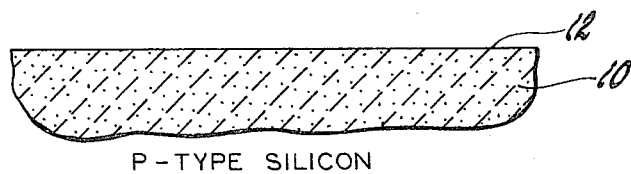

Reference is now made to the drawing in which the fabrication of one IGFET will be described. It is to be understood that many IGFETs would be simultaneously formed in the same silicon wafer to produce one or more integrated circuits in that wafer. However, for convenience, only one such transistor for one such circuit is shown. Still further, it is to be recognized that individual IGFETs of an integrated circuit are frequently formed alone or in a group on a mesa upstanding on the silicon surface, which mesa is surrounded by silicon surface portions that are more highly doped and which have a thick overlying field oxide. This latter type of IGFET is described in U.S. Pat. No. 3,751,722 Richman. To focus attention more clearly on the problems attendant etching a thick overlying glass layer, applicant has elected to omit showing the mesa construction and thick field oxide. However, it is to be understood that this invention can be used in connection with such mesa-type IGFET structures.

With the foregoing in mind, FIG. 1 shows a single IGFET portion, such as a window in a field oxide layer (not shown) on a silicon wafer 10. The wafer typically has a thickness of about 0.4–0.6 millimeter and a homogeneous resistivity of about 5–30 ohm-centimeters. The resistivity, of course, will depend upon electrical characteristics of the finished device which is desired. The thickness is ordinarily a function of the wafer size being processed, with 3 inch wafers usually being about 0.4 millimeter thick. Upper surface 12 on the wafer is lapped, polished and cleaned so that an integrated circuit can be formed on it.

Figure 2:
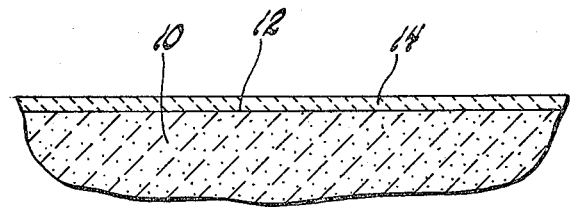

A thin layer 14 of silicon dioxide is formed on surface 12, as shown in FIG. 2. This thin silicon dioxide layer 14 is preferably about 500–1000 angstroms thick and typically can be formed by heating the silicon wafer 10 in dry or wet oxygen at a temperature of about 900–1100° C. until a layer of silicon dioxide of the desired thickness is obtained. The time of treatment, of course, will depend upon the thickness desired and the precise temperature of the treatment. However, a thickness of about 1000 angstroms can be formed by heating wafer 10 in dry oxygen for about one hour at a temperature of about 1050° C. This forms a thin silicon dioxide layer which is suitable as a gate dielectric in an IGFET and is readily penetrable by an ion beam having an energy greater than about 150 kev.

Figure 3:
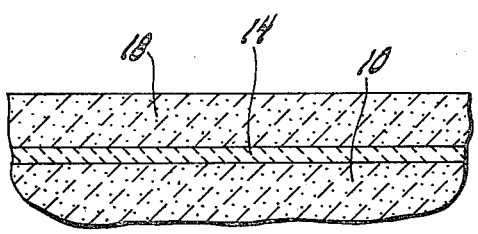

A blanket layer 18 of polycrystalline silicon is then deposited onto the silicon dioxide layer 14 as shown in FIG. 3. The polycrystalline silicon layer 18 can be formed by chemical vapor deposition, evaporation, sputtering or the like. In general, it would have a thickness of about 4000–7000 angstroms for self-aligning gate purposes. At least about 4000 angstroms is generally needed to obtain a low resistance gate. Above about 7000 angstroms in thickness, the polycrystalline silicon layer can produce undesirably high step heights. Also, thicknesses above about 7000 angstroms may require ion beam energies greater than about 150–200 kev to penetrate them. This may be important in accordance with one facet of my invention. The polycrystalline layer 18 is preferably undoped, i.e. intrinsic, as deposited, and then subsequently doped with an N-type impurity during the subsequent diffusion step in which the source and drain regions 20 and 22 are respectively formed. I prefer to dope the polycrystalline silicon with phosphorus to a sheet resistivity of about 20–50 ohms per square. However, there is no objection to so doping the polycrystalline silicon while it is being deposited, or to using ion implantation to dope it and the source and drain regions 20 and 22.

Figure 4:
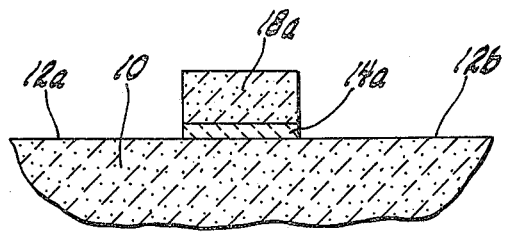

The polycrystalline silicon layer 18 is then photolithographically etched to define a gate electrode 18a and then etched again to define the underlying gate dielectric 14a, as shown in FIG. 4. Layers 18 and 14 can be etched in much the same way as described in the aforementioned U.S. Pat. No. 3,475,234 Kerwin et al. The particular manner in which the gate dielectric and electrode are defined forms no part of this invention. They can be defined in any convenient manner, including plasma etching. In any event, the definition of the gate dielectric 14a and the gate electrode 18a inherently exposes surface areas 12a and 12b on wafer 10 for diffusion of source and drain regions 20 and 22, respectively.

Figure 5:
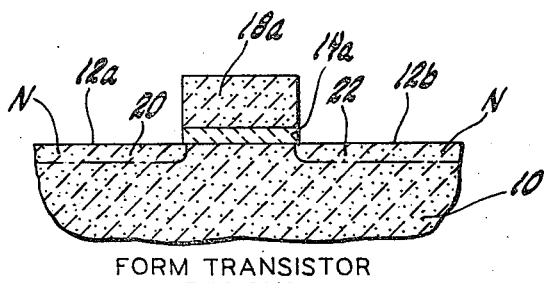

Phosphorus is then diffused into the gate electrode 18a and into the exposed surface areas 12a and 12b of wafer 10, to produce source and drain regions 20 and 22. As can be seen in FIG. 5, regions 20 and 22 are inherently aligned with gate electrode 18a. The phosphorus can be deposited onto the wafer and shallowly diffused by placing the wafer in a furnace maintained at a temperature of 950°–1050° C. About 3–5 liters per minute argon and 10–50 cc per minute oxygen flows through the furnace. After a five minute wafer preheat, additional argon is bubbled through phosphorus oxychloride at 21° C. and bled into the furnace atmosphere at a rate of about 10–100 cubic centimeters per minute. After a second five-minute period, the additional argon flow is discontinued. The wafer is left in the furnace for a third five-minute period, as a post-bake step. For purposes of illustration, FIG. 5 shows regions 20 and 22 being formed but as shallow regions.

Figure 6:
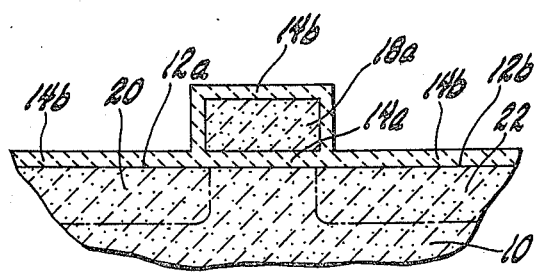
Figure 7:
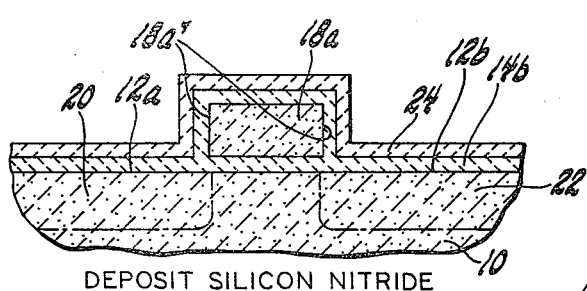

In FIG. 6, the wafer is shown after the phosphorus is more deeply driven into its surface. The phosphorus drive-in is accomplished by heating the wafer to a temperature of about 900°–1050° C. for about ½–2 hours in a moderately to strongly oxidizing atmosphere. The particular times, temperatures, and atmospheres used for deposition and drive-in are obviously a matter of choice and are principally determined by the electrical characteristics of the device desired. During drive-in, a thin silicon dioxide coating 14b is reformed over the surface portions 12a and 12b and also over the sides and upper surface of polycrystalline silicon gate electrode 18a. This coating will range in thickness from about 100 to about 1000 angstroms.

A blanket layer of silicon nitride ($Si_3N_4$), indicated by reference numeral 24, is then deposited over silicon dioxide layer 14b including portions of the latter overlying electrode 18a. The silicon nitride layer is about 200–1000 angstroms thick. Below about 200 angstroms, silicon nitride coating 24 may not be continuous, for example, by not completely covering the sides 18a' of gate electrode 18a. Thicknesses over about 1000 angstroms are unnecessary. Thicknesses of about 2000 angstroms and more can cause silicon nitride cracks, due to differences in thermal expansion. The manner in which the silicon nitride layer is deposited is not particularly critical and any convenient technique can be used. Forming silicon nitride by pyrolysis of a silicon containing hydrocarbon gas at high temperatures is disclosed in U.S. Pat. No. 3,917,495 Horn. A glow discharge plasma reaction between silane and nitrogen, with or without ammonia at about 300° C. is described in U.S. Pat. No. 4,091,406 Lewis for producing a silicon nitride coating that is not quite stoichiometric.

Figure 8:
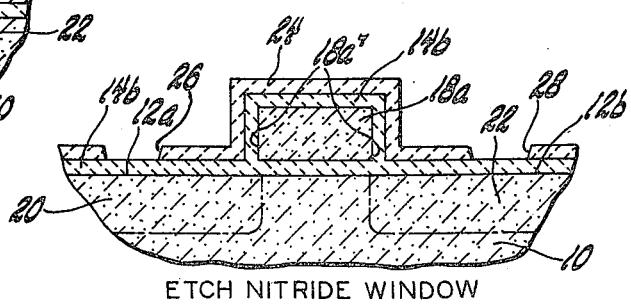

After depositing the blanket silicon nitride coating 24, source and drain contact windows 26 and 28 are opened in it. Windows 26 and 28 can be formed in any of the usual manners. For example, photolithographic etching using a photoresist layer as a mask and a carbon tetrafluoride plasma as the etchant. In the alternative, the etchant can be orthophosphoric acid ($H_3PO_4$) in which the wafer 10 is immersed at 150°–160° C. for 10–60 minutes. FIG. 8 shows the wafer after windows 26 and 28 have been opened in it.

As previously mentioned, adding the silicon nitride layer introduces more process steps. On the other hand, adding the blanket silicon nitride layer does not add a critical process step. Also, opening windows in it does not need to introduce an additional masking step. As previously mentioned, the etching of the glass overlayer 30 has heretofore been so difficult, that two separately applied, exposed and developed photoresist layers are frequently used to etch it. In such instance, two separate masking operations are involved, which use two similar yet slightly different masks. The first mask is essentially the same as the second mask but has somewhat smaller openings in it. The double masking is used to insure that the photoresist coating will withstand the rigors of etching through the relatively thick, i.e. about 10,000 angstroms, glass layer 30. The double masking avoids forming holes through the photoresist coating that are attributable to random pinholing. However, in this invention the silicon nitride layer 24 already protects silicon surface 12 and oxide layer 14b from pin holes in the photoresist. Consequently, I prefer to omit double masking when etching the glass. Instead, I use the first mask to etch source and drain contact windows 26 and 28 in the silicon nitride layer 24. However, even if double masking is still desired when etching the glass, this same mask can still be used as the first mask when etching the glass.

Following the opening of windows 26 and 28 in nitride layer 24, a blanket layer 30 of phosphorus doped glass, i.e. phosphosilicate material, is deposited over the silicon nitride layer 24. As hereinbefore mentioned, the phosphorus doped glass is used to passivate and smooth out the upper surface of the wafer. Any silicate serving this function is considered to be a glass for purposes of this invention. Any of the normal and accepted silicate materials and deposition techniques heretofore used can be used in this invention too. It can be formed in any convenient manner, as for example by chemical vapor deposition, evaporation, sputtering or the like. By way of illustration, one technique that can be used is chemical vapor deposition of silane and phosphine. The minimum glass thickness which is needed to smooth out the upper surface of the wafer will obviously vary but those same thicknesses previously used can be used in this invention also. For example, a thickness of about 5000°–15,000 angstroms can be used.

It should also be mentioned that glass layer 30 has a melting point temperature which permits reflow at about 1000–1100° C. in about 10 minutes. Higher temperatures and/or longer periods of time are not generally desired, since they can produce unwanted additional diffusion within wafer 10. FIG. 10 shows the wafer after the glass has been reflowed. As can be seen the only difference between FIGS. 9 and 10 is that the upper surface 30b of glass 30 is smooth in FIG. 10 as compared to the angularity of upper surface 30a in FIG. 9. It is recognized that the angularity in the upper surface 30a of layer 30 is somewhat exaggerated in FIG. 9 but serves well to illustrate the change due to reflow.

When glass layer 30 is photolithographically etched, contact windows 26a and 28a are not only opened in it. However, contact windows 26b and 28b are also concurrently opened in the silicon dioxide layer 14b underlying the silicon nitride layer 24 and exposed by the silicon nitride windows 26 and 28. The photolithography is done in the usual way, except that I prefer to use only one photoresist layer, as previously mentioned. The wafer 10 is also masked completely on its lower side (not shown). Wafer 10 is then immersed in a hydrofluoric acid-based etchant as for example buffered dilute hydrofluoric acid, to open the windows 26a, 26b, 28a and 28b.

If the mask used to expose the photoresist coating (not shown) was not correctly aligned or if there is an unexplainable excessive lateral etching that occurs in the glass layer 30, the contact windows 26a and 28a will not be precisely registered over their respective source and drain contact windows 26 and 28 in silicon nitride layer 24. However, the hydrofluoric acid-based etchant does not attack silicon nitride. Consequently, the silicon nitride layer remains intact and preserves the underlying silicon dioxide layer 14b in all areas except those exposed within contact windows 26a and 28a. Consequently, contact windows 26b and 28b are opened in silicon dioxide layer 14b in precise register with the contact openings 26 and 28 in the silicon nitride layer 24 regardless as to the undesired lateral etching in glass layer 30. Such a product is shown in FIG. 11. Also, a contact window (not shown) to the gate electrode 18a can be analogously formed, provided a complementary window (also not shown) has been previously opened in silicon nitride layer 24 over gate electrode 18a.

To better illustrate the lateral etching problem which this invention solves, the separation between contact windows 26 and 28 and the gate electrode 18a is exaggerated. The width of contact window 28a in glass layer 30 is correspondingly exaggerated. Hence, one can readily see that window 28a extends over gate electrode 18a. One can also see that silicon nitride layer 24 remains intact over gate electrode 18a and serves as an insulating coating over it within contact window 28a.

In the next step, a blanket coating of metal 32 of aluminum or the like is deposited over the entire coated surface of wafer 10. Metal coating 32 covers source windows 26, 26a and 26b as well as drain windows 28, 28a and 28b, so that the metal coating 26 contacts the surface 12a and 12b of wafer 10 within the respective source and drain regions 20 and 22. While metal coating 32 is shown as a single layer, it is understood that coating 32 could be formed of a multiplicity of layers, if desired.

Referring now to FIGS. 13 and 14, the metal layer 32 is photolithographically etched in a normal and accepted manner to define a source electrode 34 and a drain electrode 36. The particular technique for photolithographic etching is not material to this invention and any of the usual techniques can be used. It should also be noted in connection with FIG. 14 that discrete source and drain contacts 34 and 36 are illustrated. Filamentary wires can be bonded to these contacts, if desired, for connection to external circuitry. In an integrated circuit, each of contacts 34 and 36 would be connected by integral metallization runners disposed on the glass layer 30 to respective source and drain regions of adjacent IGFETs. It should also be understood that the source region need not even have a metallization contact directly at the site of each IGFET. For example, in a read-only-memory (ROM) type of IGFET integrated circuit, only the drain regions are discrete diffusion areas that require individual contacts. The IGFETs in a ROM are arranged in a matrix, with the source regions being interconnected by an extension of the source region diffusion between adjacent devices, so that many source regions are electrically in parallel. In such instance, only one electrode need be needed for many source regions, and it would be located at the end of a strip-like diffusion area which forms the source region and interconnect for aligned IGFETs. A plurality of such diffusion strips are used to form a plurality of IGFET columns. A single polycrystalline silicon strip, adjacent and parallel the source diffusion strip, forms a common gate electrode for all IGFETs in a column. The metallization pattern in a ROM makes contact with the individual drain regions of the IGFETs. The metallization pattern is generally a series of parallel metal strips oriented orthogonally to the gate electrode and overlying rows of discrete drain regions. One strip overlies each row of discrete drain regions, and therefore, must cross over the gate electrode strip. It can thus be seen that the gate electrode must have an insulating coating in such a device.

Such a ROM and a unique method for programming it are more fully described in my United States patent application Ser. No. 098,211, entitled "Programming an IGFET Read-Only-Memory", filed concurrently herewith and assigned to the assignee hereof. All IGFETs in a matrix are initially made operative, and then some are selectively rendered inoperative by ion implantation. In Ser. No. 098,211, contacts to source, drain and gate electrodes are made in the same manner as herein described. However, I also describe etching a window in glass layer 30 over channel region 38 of the gate electrode 18a for selected IGFETs, without also etching a corresponding window in silicon nitride layer 24. Thus, the channel region is exposed for ion implantation. However, gate electrode 18a retains an electrically insulating coating. In essence, the silicon nitride layer concurrently forms an automatic etch stop and insulating coating, upon which metallization layer 32 is subsequently applied. The entire wafer is then uniformly exposed to a high energy boron ion beam of about 150-200 kev in a dosage of about $1 \times 10^{12} - 1 \times 10^{14}$ atoms per square centimeter. This raises the threshold voltage of the channel 38 beneath the selected IGFETs in the matrix to 8-21 volts. Thus, those selected IGFETs will not turn on when a normal operating potential of only 5 volts is applied to their gate electrodes. However, contact resistance at surfaces exposed within contact windows are not significantly increased due to the high initial surface doping of the areas. The principles of this invention should be applicable to any semiconductor device in which undesired lateral etching of an overlying thick dielectric coating presents a problem.

The embodiments of the invention in which an exclusive property or privilege is claimed are defined as follows:

1. In a method of opening a contact window in a relatively thick glass coating on a semiconductor wafer surface over a semiconductor device region having a previously formed adjacent electrode, the improvement which includes depositing a thin silicon nitride coating over the device region and adjacent electrode before depositing the glass coating, opening a first window in the silicon nitride coating precisely registered for an intended electrical contact at least to said region, depositing said thick glass coating onto said silicon nitride coating, and then preferentially etching the glass coating to open a second contact window over the first contact window, whereby unintended lateral etching of said second window can occur without producing an unintended electrical contact to said previously formed electrode.

2. In a method of forming an electrical contact to a field effect transistor region through a thick glass coating which also covers an adjacent gate electrode for said transistor, the improvement which includes depositing a precisely etchable dielectric coating over the region and gate electrode before applying the glass coating, opening a first window in said precisely etchable dielectric layer over said region but not said gate electrode, applying the glass coating onto the precisely etchable dielectric coating over the region and gate electrode, opening a second window in the glass coating over the first window by means to which said another dielectric layer is substantially inert and effective to maintain an electrically insulating coating over said gate electrode even if the second window overlaps it, depositing a blanket metal coating onto said glass over said region and gate electrode, and then defining an electrical contact for said region, whereby the electrical contact can overlap the gate electrode without also electrically contacting it.

3. In a method of making discrete electrical contacts to the drain regions of a plurality of field effect transistors in an integrated circuit on a silicon slice through a relatively thick and reflowable glass layer without also inadvertently electrically contacting gate electrode portions contiguous those drain regions, the improvement which includes depositing a silicon nitride blanket layer on the slice after forming the gate electrodes and a thin silicon dioxide layer over said regions, opening discrete contact windows in the silicon nitride layer precisely registered over said drain regions with an etchant that does not significantly attack silicon dioxide, depositing a relatively thick blanket layer of reflowable glass onto said silicon nitride layer, etching contact windows in the glass layer with an etchant that also etches silicon dioxide but does not significantly attack silicon nitride, whereby portions of said regions are exposed but no gate electrode portion is inadvertently exposed even if the glass layer inadvertently overlaps it, and then forming on the glass layer a metallization pattern which contacts said drain regions through said windows but which is substantially protected from unintended electrical contact with said gate electrodes by said silicon nitride coating.

* * * * *